United States Patent
Nakai et al.

(10) Patent No.: US 9,104,118 B2
(45) Date of Patent: Aug. 11, 2015

(54) EXPOSURE DEVICE AND METHOD FOR PRODUCING STRUCTURE

(71) Applicant: HITACHI HIGH-TECHNOLOGIES CORPORATION, Tokyo (JP)

(72) Inventors: Naoya Nakai, Tokyo (JP); Yoshisada Ebata, Tokyo (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 0 days.

(21) Appl. No.: 14/360,987

(22) PCT Filed: Dec. 5, 2012

(86) PCT No.: PCT/JP2012/081438
§ 371 (c)(1),
(2) Date: May 28, 2014

(87) PCT Pub. No.: WO2013/084906
PCT Pub. Date: Jun. 13, 2013

(65) Prior Publication Data
US 2014/0327897 A1    Nov. 6, 2014

(30) Foreign Application Priority Data
Dec. 9, 2011 (JP) .................................. 2011-269520

(51) Int. Cl.
*G03H 1/02* (2006.01)
*G03H 1/28* (2006.01)
(Continued)

(52) U.S. Cl.
CPC .......... *G03F 7/70408* (2013.01); *G03F 7/7085* (2013.01); *G03H 1/0402* (2013.01); *G03H 1/0486* (2013.01); *G02B 27/60* (2013.01); *G03H 1/28* (2013.01); *G03H 2001/0413* (2013.01)

(58) Field of Classification Search
CPC . G03F 7/70408; G03F 7/7085; G03H 1/0486; G03H 1/0402; G03H 2001/0413; G03H 1/28; G02B 27/60
See application file for complete search history.

(56) References Cited

U.S. PATENT DOCUMENTS 5,006,716 A * 4/1991 Hall ........................... 250/458.1
2008/0165820 A1* 7/2008 Fukuda ........................... 372/53

FOREIGN PATENT DOCUMENTS

JP    62-003280 A    1/1987
JP    02-287501 A    11/1990
(Continued)

OTHER PUBLICATIONS

Van Soest et al. "Laser interference lithography with highly accurate interferometric alignment", Proc. ECIO'05 (4 pages) (2005).*
(Continued)

*Primary Examiner* — Martin Angebranndt
(74) *Attorney, Agent, or Firm* — Mattingly & Malur, PC

(57) ABSTRACT

In order to exposure interference fringes to photoresist and form a desired irregular pattern, it is necessary to know the cycle of the interference fringes in advance. In order to confirm the cycle of the interference fringes beforehand, conventional techniques include observing the formed irregular pattern with the use of a microscope or measuring a diffraction angle of incident light and repeating processes of exposure, development, and observation (measurement) while slightly changing incident angles of light fluxes for the formation of the interference fringes until a desired cycle is confirmed. These operations take considerable amount of time. The fact that it takes considerable amount of time to confirm the interference fringes has not been considered in the conventional techniques. Observation of a moire generated by a standard sample containing a fluorescent sample that can be repeatedly used and adjustment of the cycle of interference fringes reduce time for the adjustment.

6 Claims, 6 Drawing Sheets

(51) Int. Cl.
*G03F 7/20* (2006.01)
*G03H 1/04* (2006.01)
*G02B 27/60* (2006.01)

(56) References Cited

FOREIGN PATENT DOCUMENTS

| JP | 05-072409 | A | | 3/1993 |
|---|---|---|---|---|
| JP | 05-141926 | A | | 6/1993 |
| JP | 2000-019316 | A | | 1/2000 |
| JP | 2007-064966 | A | | 3/2007 |
| JP | 2011-095445 | | * | 5/2011 |

OTHER PUBLICATIONS

Post, "Moire interferometry for engineering and science", Proc. SPIE vol. 5776 pp. 29-43 (2005).*

Brunner et al. "Moire techniques for overlay metrology", Proc. SPIE vol. 480 pp. 164-170 (1984).*

* cited by examiner (a)

(b)

(a)

(b)

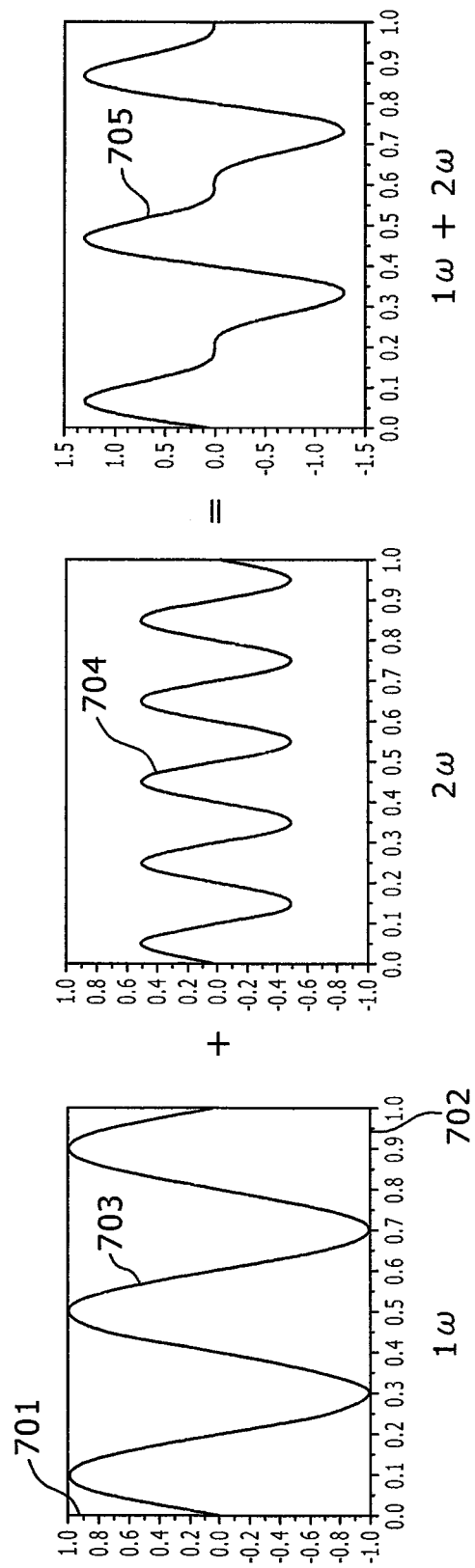

EXPOSURE DEVICE AND METHOD FOR PRODUCING STRUCTURE

TECHNICAL FIELD

The present invention relates to an exposure device and a method for producing its structure. The invention relates to, for example, an optical interference field, and more particularly to an interference exposure technique.

BACKGROUND ART

An interference exposure method may be used to form a structure of a certain type on a substrate. The interference exposure method is to cause a plurality of divided light fluxes to interfere with each other at an angle to thereby form interference fringes. Techniques related to the interference exposure are described in the following Patent Documents 1 to 3.

PRIOR ART DOCUMENTS

Patent Documents

Patent Document 1: JP-2000-19316-A
Patent Document 2: JP-H5-1411926-A
Patent Document 3: JP-2007-64966-A

SUMMARY OF THE INVENTION

Problems to be Solved by the Invention

In the interference exposure method, a cycle of the interference fringes is controlled with incident angles of the light fluxes. In Patent Document 1, interference fringes are exposed to photoresist. However, when a desired irregular pattern is to be formed with the interference fringes formed on the photoresist, for example, exposed to light, it is necessary to know the cycle of the interference fringes in advance. In order to confirm the cycle of the interference fringes in advance, it is necessary in conventional techniques to observe the formed irregular pattern with the use of a microscope or to measure a diffraction angle of incident light in order to repeat processes of exposure, development, and observation (measurement) while slightly changing the incident angles of the light fluxes for the formation of the interference fringes until a desired cycle is confirmed. These operations take considerable amount of time. In the conventional techniques, the fact that it takes time to confirm the interference fringes has not been considered.

Means for Solving the Problems

In the present invention, observation of a moire generated by a standard sample containing a fluorescent sample that can be repeatedly used and adjustment of the cycle of interference fringes reduce time for the adjustment.

Effect of the Invention

According to the invention, the cycle of interference fringes can be obtained in a shorter cycle time than conventional techniques.

BRIEF DESCRIPTION OF THE DRAWINGS

FIG. 7 is a diagram describing the third embodiment.

MODE FOR CARRYING OUT THE INVENTION

Hereinafter, embodiments of the invention are described with reference to the accompanying drawings. Although the embodiments of the invention are described, the invention is not limited to the embodiments.

First Embodiment

Figure 1:
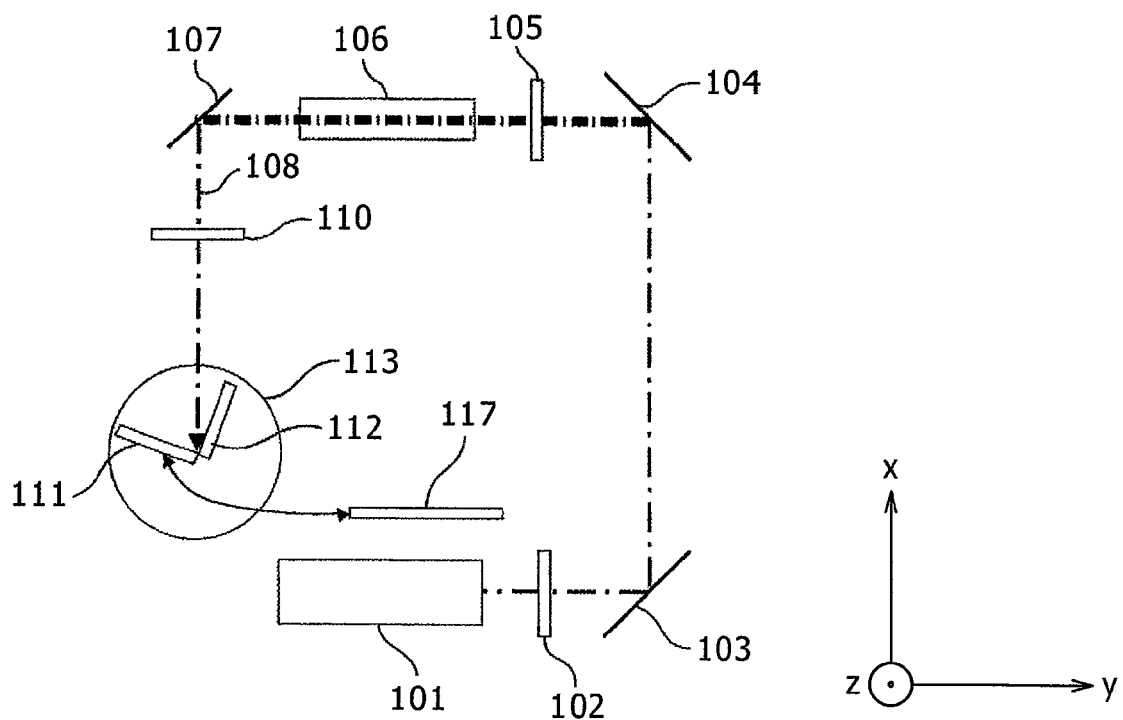
FIG. 1 are diagrams describing an exposure device according to a first embodiment.
Figure 1:
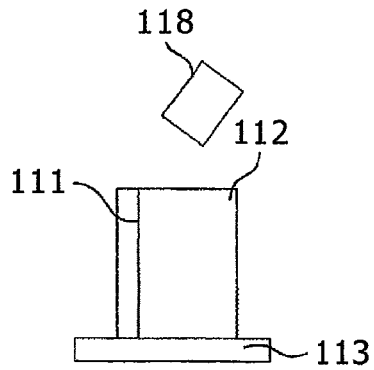

FIG. 1 are diagrams describing an exposure device according to the present embodiment. FIG. 1(a) is a diagram describing the exposure device when the exposure device is viewed from above while FIG. 1(b) is a diagram describing an arrangement of a standard sample ill, a mirror 112, and a camera 118. In FIG. 1, light emitted from a coherent light source 101 is controlled at a shutter 102. When the shutter 102 opens, the light is reflected by a mirror 103 and a mirror 104 and incident on a ½ wavelength plate 105. The light, whose polarization direction is controlled by the ½ wavelength plate 105, is expanded and collimated by a beam expander 106 and incident on and reflected by a mirror 107 so as to form reflected light 108. Irradiation with the reflected light 108 is controlled at a shutter 110. When the shutter 110 opens, the reflected light 108 is incident on the standard sample 111 (of which a structure is described later) arranged outside the center of a rotary stage 113 and is incident on a mirror 112. The light that is directly incident on the standard light 111 and the light that is reflected by the mirror 112 and incident on the standard sample 111 interfere with each other to form first interference fringes. The standard sample 111 and the mirror 112 are arranged in such a manner that at least a certain angle is created between the standard sample 111 and the mirror 112. The first interference fringes formed on the standard sample 111 excite the fluorescent sample (described later), whereby generated scattered light is diffracted by a diffraction grating included in the standard sample 111, and the diffracted light interferes so as to form second interference fringes. The first interference fringes formed by the light emitted from the coherent light source 101 and the second interference fringes formed by means of the diffraction grating included in the standard sample form moire fringes. Angles of the moire fringes with respect to a direction in which diffraction grating grooves of the standard sample extend are observed and measured with the camera 118 that is obliquely arranged above so as not to interrupt exposure. The cycle of the interference fringes is thereby calculated through the observation and measurement with the camera 118. An enlargement optical system can be arranged in front of the camera.

In this case, while an operator confirms an image acquired by the camera 118, incident angles of the light on the standard sample 111 are controlled through rotating the rotary stage 113 to change the cycle of the interference fringes. Then, the interference fringes that cause a desired cycle of the interference fringes can be obtained by way of stopping the rotary stage 113 positioned when the angles of the moire fringes cause the desired cycle to be calculated. Lastly, the standard sample 111 is replaced with an exposure sample 117 that has been coated with a photosensitive material and on which a structure is actually to be formed. An irregular pattern in which protruding and recessed portions are accordingly arranged at the desired cycle is formed on the exposure sample 117 through the exposure, development, and baking.

Figure 2:
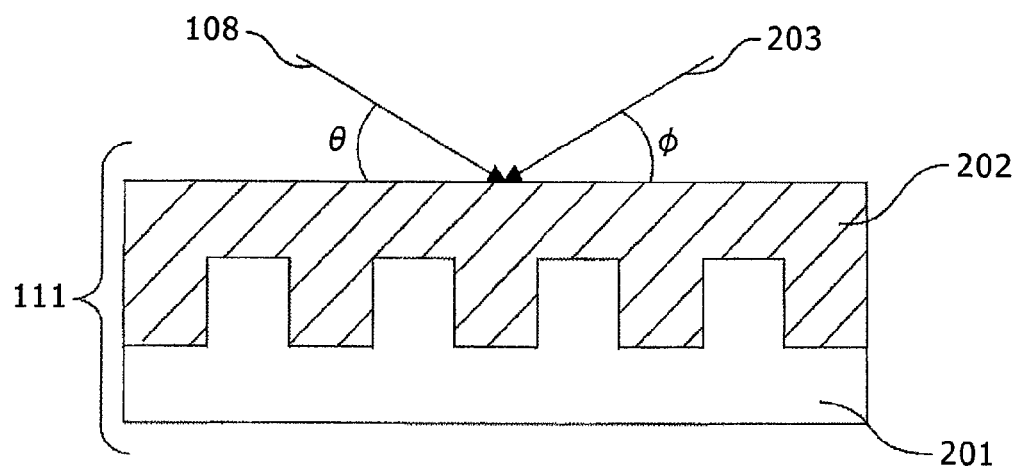
FIG. 2 is a diagram describing a standard sample 111.

The standard sample 111 will now be explained with reference to FIG. 2. The standard sample 111 mainly includes a diffraction grating 201 having protruding portions and recessed portions arranged at given intervals, and a fluorescent sample 202 such as a fluorescent pigment and a fluorescent dye. In this case, it is preferable that the thickness of the fluorescent sample 202 be larger than the protruding portions of the diffraction grating 201. A line-and-space pattern is three-dimensionally formed in the diffraction grating 201. In addition, it is preferable that the fluorescent sample 202 have an ability to absorb the light emitted from the light source and having a wavelength. In the present embodiment the reflected light 108 and light 203 reflected by the mirror 112 are incident on the standard sample 111 so as to form the first interference fringes.

Figure 3:
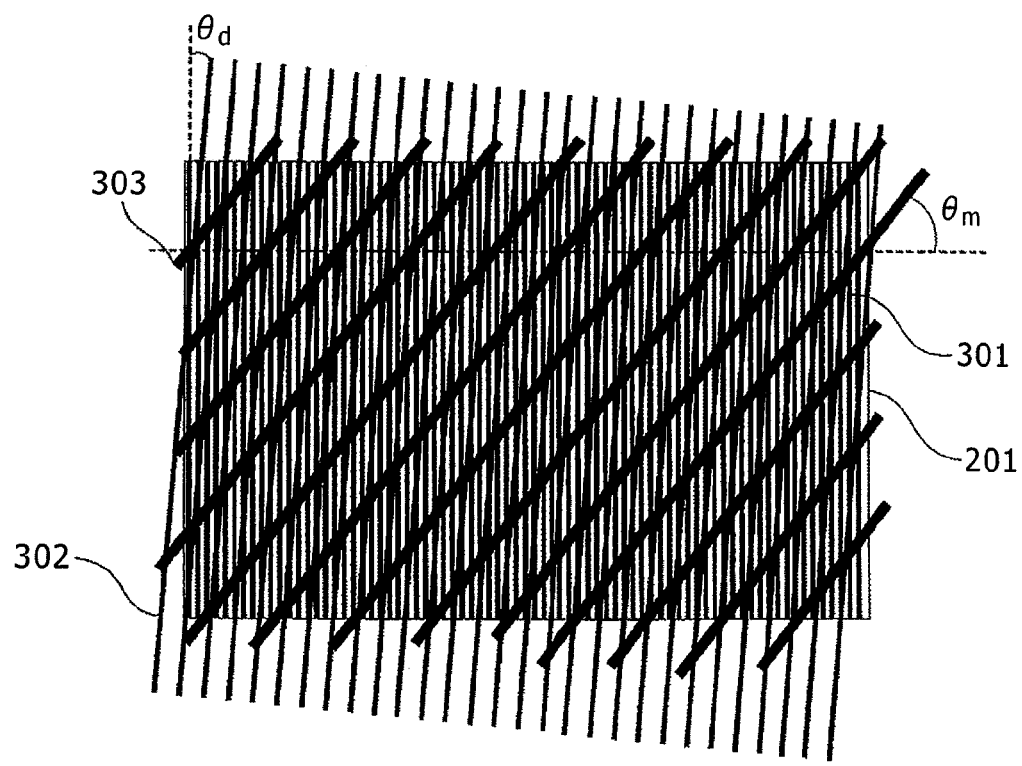
FIG. 3 is a diagram describing moire fringes.

The moire fringes will now be explained with reference to FIG. 3. The generation of moire fringes 303 attributes to first interference fringes 301 and second interference fringes 302. The first interference fringes 301 is formed through the interference of the light directly incident on the standard sample 111 with the light reflected by the mirror 112 and incident on the standard sample 111. The second interference fringes 302 is formed through the interference of the diffracted light. The camera 118 images the moire fringes 303.

A cycle $d_g$ of the second interference fringes 302 is expressed by the following Equation (1), where inclination angles of an interference pattern of the incident light with respect to the line-and-space pattern of the diffraction grating 201 are $\theta_d$, and the angles of the moire fringes 303 are $\theta_m$. In Equation (1), $\lambda$ is the wavelength of the light emitted from the coherent light source 101 and n is a refraction index of the standard sample and an atmosphere around the standard sample.

$$d_g = \lambda/n(\sin\theta_d + \sin\theta_m) \quad (1)$$

When a cycle of the first interference fringes is represented by $d_E$, the following Equation (2) expressing the relationship between the cycle $d_E$ and $d_g$ is established.

$$d_E = d_g/[2\cos\theta_m/\{\cos(\theta_d+\theta_m)+\cos\theta_m\}] \quad (2)$$

The cycle $d_E$ of the first interference fringes is important to the interference exposure. The wavelength $\lambda$ and the refraction index n are given values. In addition, the angles $\theta_d$ and $\theta_m$ can be obtained through analyzing the image acquired with the camera 118. Specifically, the cycle $d_g$ can be calculated. Since the angles $\theta_d$ and $\theta_m$ and the cycle $d_g$ are given values, the cycle $d_E$ can be calculated as well. Therefore, the cycle $d_E$ can be achieved when $\lambda$, n, $\theta_d$, and $\theta_m$ can be obtained. Furthermore, the repetitive cycle $d_E$ can be obtained since the fluorescent sample 202 can be repeatedly used, unlike the photoresist. As a result, the cycle of the interference fringes can be obtained in a short time.

Figure 4:
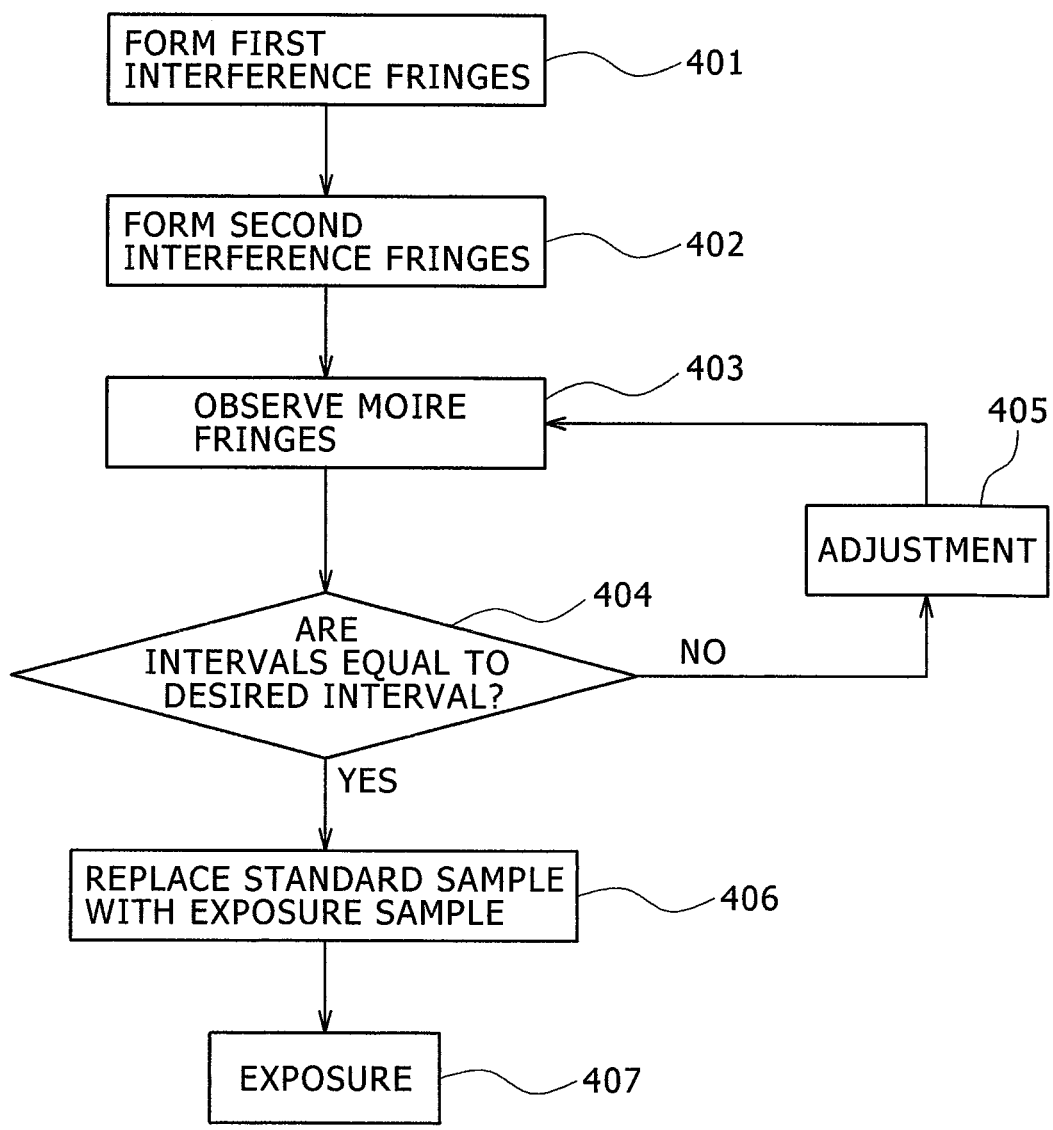
FIG. 4 is a flowchart according to the first embodiment.

A procedure according to the present embodiment is illustrated in FIG. 4. In step 401, the first interference fringes are formed on the standard sample 111. In step 402, the second interference fringes are formed. In step 403, the angles $\theta_d$ and $\theta_m$ of the moire fringes formed mainly by the first and second interference fringes are observed. In step 404, it is determined whether the cycle of the first interference fringes is equal to a desired cycle. If the cycle of the first interference fringes is not equal to the desired cycle, the rotary stage 113 is rotated and steps 403 and 404 are repeated. After the cycle of the first interference fringes becomes equal to the desired cycle, the standard sample 111 is replaced with the exposure sample 117 by use of a transporting device such as a robot arm in step 406. In step 407, the interference exposure is performed on the exposure sample with the use of the first interference fringes arranged at the desired cycle. In the present embodiment, the cycle of the interference fringes for the interference exposure can be obtained in a short time. In addition, the efficiency of an operation for the exposure can be improved.

Second Embodiment

Figure 5:
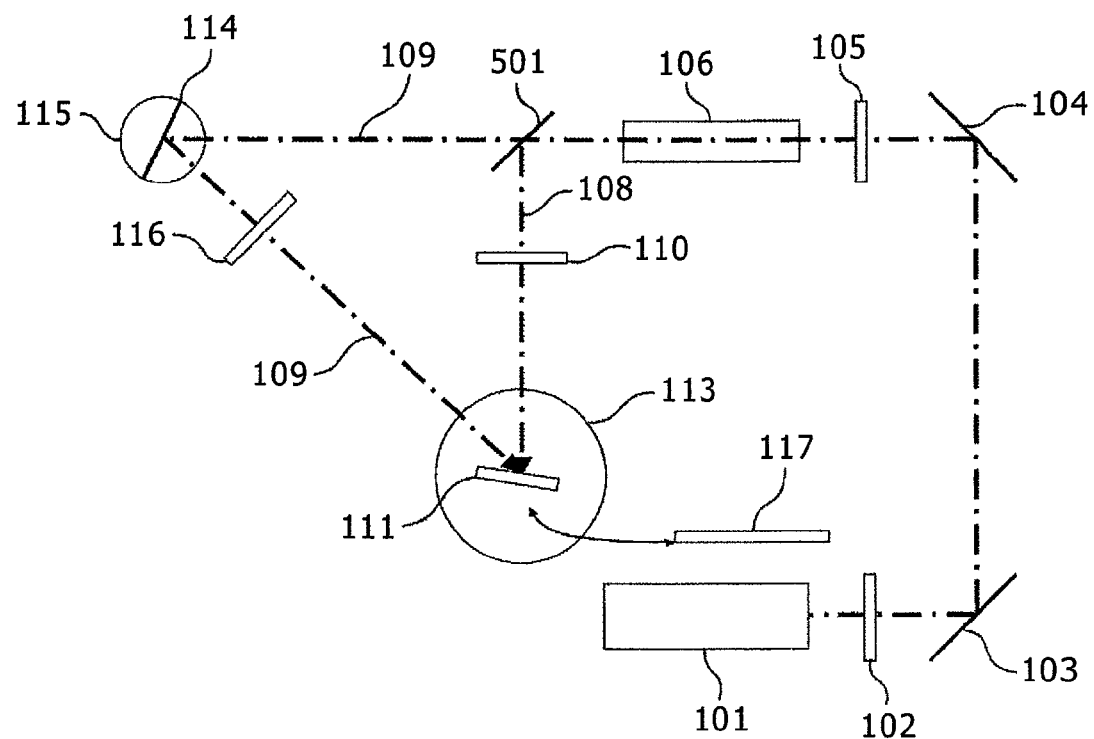
FIG. 5 are diagrams describing a second embodiment.
Figure 5:
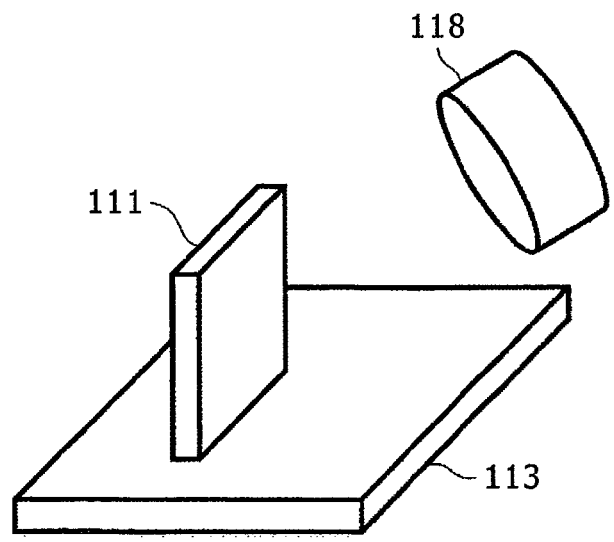

A second embodiment will now be explained with reference to FIG. 5. FIG. 5(a) is a diagram illustrating an exposure device when the exposure device is viewed from above, while FIG. 5(b) is a diagram describing an arrangement of the standard sample 111 and the camera 118. The second embodiment mainly describes differences between the second embodiment and the first embodiment. The differences between the second embodiment and the first embodiment are that a half mirror 501 is provided instead of the mirror 107, the mirror 112 is not used, and the standard sample is placed on a central portion of the rotary stage 113 in the second embodiment.

A configuration in which the light emitted from the coherent light source 101 reaches the half mirror 401 in the second embodiment is same as the first embodiment. In the second embodiment, the mirror 112 used in the first embodiment is removed and the standard sample 111 is moved to the central portion of the rotary stage 113. The light that has reached the half mirror 501 is branched into reflected light 108 and transmitted light 109. At this point, irradiation with the reflected light 108 is controlled by the shutter 110. The transmitted light 109 is incident on and reflected by a mirror 114 arranged on a rotary stage 115. Irradiation with the transmitted light 109 is controlled at a shutter 116. In the second embodiment, the rotary stage 113 and the rotary stage 115 are rotated, and the reflected light 108 and the transmitted light 109 are adjusted such that the same point on the standard sample 111 is irradiated with the reflected light 108 and the transmitted light 109. The rotary stage 113 is moved in a vertical direction of FIG. 5. At this point, first interference fringes are formed on the standard sample ill through interference of the reflected light 108 with the transmitted light 109. The first interference fringes formed on the standard sample 111 excite the fluorescent sample of the standard sample 111, thereby generating scattered light. The generated scattered light is diffracted at the diffraction grating portion of the standard sample 111, and the diffracted light interferes and forms second interference fringes. The first interference fringes formed with the reflected light 108 and the transmitted light 109, and the second interference fringes formed with the diffraction grating of the standard sample ill thereafter form moire fringes. Angles of the moire fringes with respect to the direction in which the diffraction grating grooves of the standard sample extend are observed and measured with the camera 118 that is obliquely arranged above so as not to interrupt the exposure. The cycle of the first interference fringes is then calculated as a result of the measurement with the camera 118. If the cycle of the first interference fringes is equal to a desired cycle, the standard sample 111 is replaced with the exposure sample 117 and the exposure is performed with the use of the first interference fringes. If the cycle of the first interference fringes is not equal to the desired cycle, the rotary stage 113 is rotated until the cycle of the first interference fringes becomes equal to the desired cycle.

Third Embodiment

Figure 6:
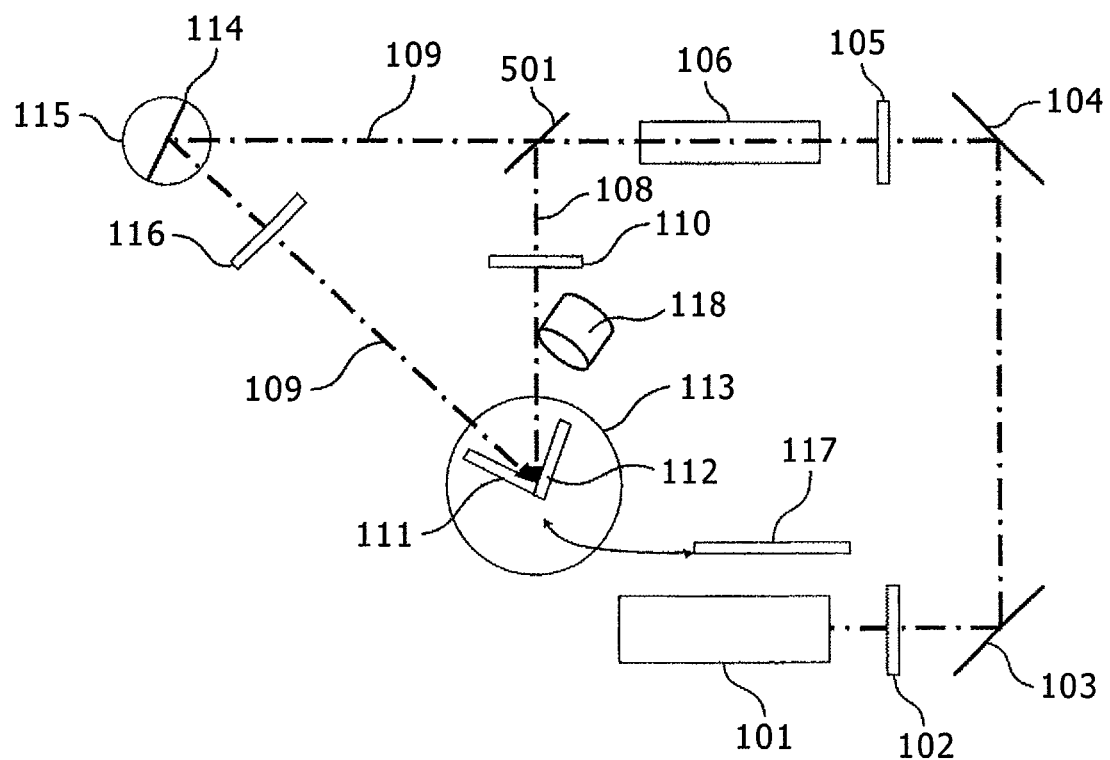
FIG. 6 is a diagram describing a third embodiment.

A third embodiment will now be explained with reference to FIGS. 6 and 7. The third embodiment mainly describes differences between the third embodiment and the first and second embodiments. In the third embodiment, a left-right asymmetric structure is formed. The light, emitted from the coherent light source 101, is incident on the half mirror 501 after passing through the mirror 103, the mirror 104, and the ½ wavelength plate 105. The light emitted from the coherent light source 101 is branched into the reflected light 108 and the transmitted light 109 by means of the half mirror 501. When the shutter 116 closes and the shutter 110 opens, the reflected light 108 is incident on the standard sample 111 and the mirror 112. Moire fringes are formed through the incidence of the reflected light 108 on the standard sample 111 as described in the first embodiment. The moire fringes due to the reflected light 108 are referred to as first moire fringes. The first moire fringes are observed with the camera 118. The cycle of the interference fringes of the reflected light 108 and the light reflected by the mirror 112 is adjusted to a desired cycle (first cycle col) at the process flow illustrated in FIG. 4.

Subsequently, the shutter 110 closes and the shutter 116 opens. The transmitted light 109 is then reflected by the mirror 114 of which an angle has been controlled at the rotary stage 115. The standard sample 111 and the mirror 112 are irradiated with the transmitted light 109. Moire fringes are formed through the incidence of the transmitted light 109 on the standard sample as described in the first embodiment. The moire fringes due to the transmitted light 109 are referred to as second moire fringes. The second moire fringes are observed with the camera 118. The cycle of the interference fringes of the transmitted light 109 and the light reflected by the mirror 112 is adjusted to a cycle (second cycle ω2) at the process flow illustrated in FIG. 4. The second cycle ω2 is a half of the first cycle ω1. When the adjustment has been completed, the shutter 116 closes. The standard sample is illuminated by the reflected light 108 and the transmitted light 109 from at least two directions.

Next, the standard sample 111 is replaced with the exposure sample 117 coated with the photosensitive material. After the standard sample 111 has been replaced with the exposure sample 117, the shutter 110 opens for a period (first exposure time) corresponding to the sensitivity of the photosensitive material. Subsequently, when the shutter 110 has closed, the shutter 116 opens for a period (second exposure time) that is a half of the first exposure time. After that, processes of development and baking are performed so as to form a periodic left-right asymmetric irregular pattern on the exposure sample 117. It is important at this time that the ratio of the first cycle to the second cycle be 2:1. If the ratio is not established, a periodic modulation will occur in the irregular pattern. If the ratio holds, the exposure sample 117 will be exposed to light at exposure intensities illustrated in FIG. 7. Specifically, when an ordinate 701 indicates an intensity and an abscissa 702 indicates a frequency, a pattern formed on the exposure sample 117 through the interference fringes of the reflected light 108 and the light reflected by the mirror 112 corresponds to a waveform 703. A pattern formed on the exposure sample 117 through the interference fringes of the transmitted light 109 and the light reflected by the mirror 112 corresponds to a waveform 704. A final irregular pattern corresponds to a waveform 705 obtained by way of overlapping the waveform 704 with the waveform 704.

Although the embodiments of the invention are described above, various asymmetric patterns can be formed through the disclosure of the present embodiment. An example of this is a diffraction grating. The diffraction grating can be included in various analyzing and inspecting devices that illuminate a certain object with light and disperse the light from the object.

DESCRIPTION OF REFERENCE NUMERALS

101 Coherent light source
102, 110, 116 Shutter
103, 104, 107, 112, 114 Mirror
105 ½ wavelength plate
106 Beam expander
108 Reflected light
109 Transmitted light
111 Standard sample
113, 115 Rotary stage
117 Exposure sample
118 Camera
201 Diffraction grating
202 Fluorescent sample
301 First interference fringes (interference fringes due to interference exposure)
302 Second interference fringes (interference fringes due to diffraction grating)
303 Moire fringes

The invention claimed is:

1. A production method for producing a structure, comprising the steps of:
    illuminating a standard sample having a grating pattern and a fluorescent sample coated on the grating pattern with a first light in an interference exposure;
    observing a first moire fringe generated by diffracted and fluorescent light during the illumination of the standard sample;
    obtaining a cycle of an interference fringe of the interference exposure from the moire fringe;
    removing the standard sample and replacing it with a substrate coated with a photosensitive material; and
    exposing the substrate coated with the photosensitive material to the interference exposure to record the interference fringe.

2. The production method according to claim 1, further comprising the step of:
    rotating the standard sample.

3. The production method according to claim 1, further comprising the steps of:
    illuminating the standard sample with a second light in an interference exposure from a direction different from a direction of the first light;
    observing a second moire fringe generated between diffracted and fluorescent light during illumination by the second light;
    obtaining a cycle of a second interference fringe of the interference exposure by the second light; and
    performing a second exposure of the substrate coated with the photosensitive material with to record the second interference fringe,
    wherein the cycle of the second interference fringe is different from the cycle of the first interference fringe.

4. An exposure device, comprising:
    an illumination system configured to emit light in an interference exposure;
    a standard sample configured to receive the light in the interference exposure; and
    a camera,
    wherein the standard sample includes a diffraction grating coated with a fluorescent sample and generates a moire fringe between diffracted and fluorescent light from the interference exposure, and
    wherein the camera observes the moire fringe.

5. The exposure device according to claim 4, further comprising:
    a rotary stage configured to hold the standard sample.

6. The exposure device according to claim 5, further comprising:
   a mirror arranged on the rotary stage in such a manner as to form an angle with the standard sample.

* * * * *